(12) United States Patent
Guo et al.

(10) Patent No.: US 12,105,135 B2
(45) Date of Patent: Oct. 1, 2024

(54) INSULATION IMPEDANCE DETECTION CIRCUIT, IMPEDANCE DETECTION METHOD, CONVERTER AND PHOTOVOLTAIC CENTRIFUGE

(71) Applicant: Gree Electric Appliances, Inc. of Zhuhai, Guangdong (CN)

(72) Inventors: Yongying Guo, Guangdong (CN); Meng Huang, Guangdong (CN); Yingyi Jiang, Guangdong (CN); Songru Huang, Guangdong (CN); Xiaogao Liu, Guangdong (CN)

(73) Assignee: Gree Electric Appliances, Inc. of Zhuhai, Guangdong (CN)

( * ) Notice: Subject to any disclaimer, the term of this patent is extended or adjusted under 35 U.S.C. 154(b) by 148 days.

(21) Appl. No.: 18/016,112

(22) PCT Filed: Sep. 16, 2021

(86) PCT No.: PCT/CN2021/118712
§ 371 (c)(1),
(2) Date: Jan. 13, 2023

(87) PCT Pub. No.: WO2022/110989
PCT Pub. Date: Jun. 2, 2022

(65) Prior Publication Data
US 2023/0273252 A1    Aug. 31, 2023

(30) Foreign Application Priority Data
Nov. 25, 2020 (CN) .......................... 202011340806.7

(51) Int. Cl.
*G01R 31/14* (2006.01)
*G01R 27/16* (2006.01)
(Continued)

(52) U.S. Cl.
CPC ............. *G01R 31/14* (2013.01); *G01R 27/16* (2013.01); *G08B 21/185* (2013.01); *H02S 50/10* (2014.12)

(58) Field of Classification Search
CPC ...... G01R 27/025; G01R 27/16; G01R 31/14; G01R 31/1227; G08B 21/185; H02S 50/10; Y02E 10/50
See application file for complete search history.

(56) References Cited

U.S. PATENT DOCUMENTS 7,576,547 B2 *   8/2009   Muller .................... G01R 27/18
                                                              324/555
2017/0138995 A1   5/2017   Rodrigues et al.

FOREIGN PATENT DOCUMENTS

CN     102854395 A  *  1/2013
CN     105676086 A      6/2016
(Continued)

OTHER PUBLICATIONS

Extended European Search Report, EP 21896493, Jan. 19, 2024.

*Primary Examiner* — Jay Patidar
(74) *Attorney, Agent, or Firm* — The Webb Law Firm

(57) ABSTRACT

Disclosed in the present disclosure are an insulation resistance detection circuit, a resistance detection method, a converter and a photovoltaic centrifuge. The insulation resistance detection circuit includes a resistance detection module connected between a positive electrode and a negative electrode of a direct-current bus to be detected. The resistance detection module includes a first resistance bridge and a second resistance bridge arranged in parallel. The first resistance bridge is connected to the positive electrode of the direct-current bus by means of a first sampling resistor R1. The second resistance bridge is connected to the negative electrode of the direct-current bus by means of a second sampling resistor R2, and both the first sampling resistor R1
(Continued)

and the second sampling resistor R2 are equipped with voltage sampling chips. The resistance detection module is configured to calculate an insulation resistance value of the direct-current bus according to voltage values of the two sampling resistors before and after a first switch S is switched.

15 Claims, 3 Drawing Sheets

(51) Int. Cl.
 *G08B 21/18* (2006.01)
 *H02S 50/10* (2014.01)

(56) References Cited

FOREIGN PATENT DOCUMENTS

| | | | |
|---|---|---|---|
| CN | 108333429 | A | 7/2018 |
| CN | 207799007 | U | 8/2018 |
| CN | 109061309 | A | 12/2018 |
| CN | 111812474 | A * | 10/2020 |
| CN | 111856144 | A | 10/2020 |
| CN | 112311328 | A | 2/2021 |
| EP | 2975720 | A1 | 1/2016 |
| WO | 2022110989 | A1 | 6/2022 |

\* cited by examiner

INSULATION IMPEDANCE DETECTION CIRCUIT, IMPEDANCE DETECTION METHOD, CONVERTER AND PHOTOVOLTAIC CENTRIFUGE

CROSS-REFERENCE TO RELATED APPLICATIONS

The present application is a U.S. National Stage Application under 35 U.S.C. § 371 of International Patent Application No. PCT/CN2021/118712, filed on Sep. 16, 2021, which claims priority to Chinese Patent Application No. 202011340806.7 filed on Nov. 25, 2020, the disclosures of which are hereby incorporated by reference in their entireties.

BACKGROUND OF THE INVENTION

Field of the Invention

The present disclosure relates to an insulation impedance detection circuit, an impedance detection method, a converter, and a photovoltaic centrifuge.

Description of Related Art

Photovoltaic insulation impedance is an indicator to judge electrical insulation performance of photovoltaic modules. Aging of power cables and other insulation materials or even insulation breakage will greatly reduce the insulation strength, and may affect safety of personnel or normal operation of low-voltage electrical equipment. Photovoltaic insulation performance detection is meaningful to ensure the safety of operations staff and the normal operation of electrical equipment.

SUMMARY OF THE INVENTION

According to an aspect of the disclosure, an insulation impedance detection circuit is provided. The insulation impedance detection circuit comprises: an impedance detection module connected between a positive terminal and a negative terminal of a direct-current bus to be detected, the impedance detection module comprising a first resistance bridge and a second resistance bridge arranged in parallel, wherein the first resistance bridge is composed of a first resistor R3 and a second resistor R4 connected in series, a connection line between the first resistor R3 and the second resistor R4 being grounded, and the second resistance bridge is composed of a third resistor R5, a fourth resistor R6, and a first switch S disposed between the third resistor R5 and the fourth resistor R6, the third resistor R5 or the fourth resistor R6 being grounded through the first switch S.

The first resistor R3 and the third resistor R5 are connected to the positive terminal of the direct-current bus to be detected through a first sampling resistor R1, the second resistor R4 and the fourth resistor R6 are connected to the negative terminal of the direct-current bus to be detected through a second sampling resistor R2, each of the first sampling resistor R1 and the second sampling resistor R2 being provided with a voltage sampling chip, and the impedance detection module is configured to calculate an insulation impedance value of the direct-current bus to be detected according to voltage values of two sampling resistors before and after switching of the first switch S. The present disclosure further provides an impedance detection method of the insulation impedance detection circuit, comprising: connecting the impedance detection module between the positive terminal and the negative terminal of the direct-current bus to be detected; switching the first switch S to ground one of the third resistor R5 or the fourth resistor R6; detecting voltage values of the first sampling resistor R1 and the second sampling resistor R2, and calculating a first positive-to-ground voltage $V_{positive\text{-}to\text{-}ground\ 1}$ and a first negative-to-ground voltage $V_{negative\text{-}to\text{-}ground\ 1}$ of the direct-current bus to be detected according to the voltage values; switching the first switch S to ground another one of the third resistor R5 or the fourth resistor R6; detecting voltage values of the first sampling resistor R1 and the second sampling resistor R2, and calculating a second positive-to-ground voltage $V_{positive\text{-}to\text{-}ground\ 2}$ and a second negative-to-ground voltage $V_{negative\text{-}to\text{-}ground\ 2}$ of the direct-current bus to be detected according to the voltage values; and calculating the insulation impedance value of the direct-current bus to be detected according to the first positive-to-ground voltage $V_{positive\text{-}to\text{-}ground\ 1}$, the first negative-to-ground voltage $V_{negative\text{-}to\text{-}ground\ 1}$, the second positive-to-ground voltage $V_{positive\text{-}to\text{-}ground\ 2}$ and the second negative-to-ground voltage $V_{negative\text{-}to\text{-}ground\ 2}$.

The present disclosure further provides a converter adopting the insulation impedance detection circuit described above.

The present disclosure further provides a photovoltaic centrifuge with the converter described above, wherein the direct-current bus to be detected is a direct-current bus of a photovoltaic module.

BRIEF DESCRIPTION OF THE DRAWINGS

The present disclosure will be described in detail below in conjunction with embodiments and drawings, wherein.

DESCRIPTION OF THE INVENTION

In the related art, a known insulation impedance detection method is an unbalanced resistance method. For example, the values of positive-to-ground and negative-to-ground voltages of a bus can be directly collected, and in combination with an output value of a direct-current leakage current sensor, a branch grounding resistance value can be calculated. The direct sampling of positive-to-ground and negative-to-ground voltages of a direct-current bus requires a voltage sensor. The higher the accuracy of the voltage sensor, the greater the cost, so the lower the practicality, making it difficult to be widely used.

Moreover, even in a design that a sampling resistor is provided in an impedance detection circuit and a voltage of the sampling resistor is detected to calculate positive-to-ground and negative-to-ground voltages of a direct-current bus, since the unbalanced resistance value is very large, according to an impedance calculation formula, an error in the sampled voltage may be amplified hundreds of times. In addition, a voltage sampling chip itself has a certain error, which generally needs to be sampled and corrected through software. However, the correction value required by each impedance detection module is different. In the related art known to the inventors, the existing correction method of the voltage sampling chip involves manually specifying a correction value to correct the sampling chip alone, which is less flexible and difficult to implement.

In view of this, embodiments of the present disclosure provide an insulation impedance detection circuit to implement insulation impedance value calculation and reduce cost.

For example, the present disclosure proposes an insulation impedance detection circuit, an impedance detection method, a converter and a photovoltaic centrifuge. The insulation impedance detection circuit provides a sampling resistor between the positive terminal and negative terminal of a direct-current bus to be detected, and samples a voltage value of the sampling resistor through a voltage sampling chip, so as to realize the calculation of insulation impedance values with low circuit cost.

Figure 1:
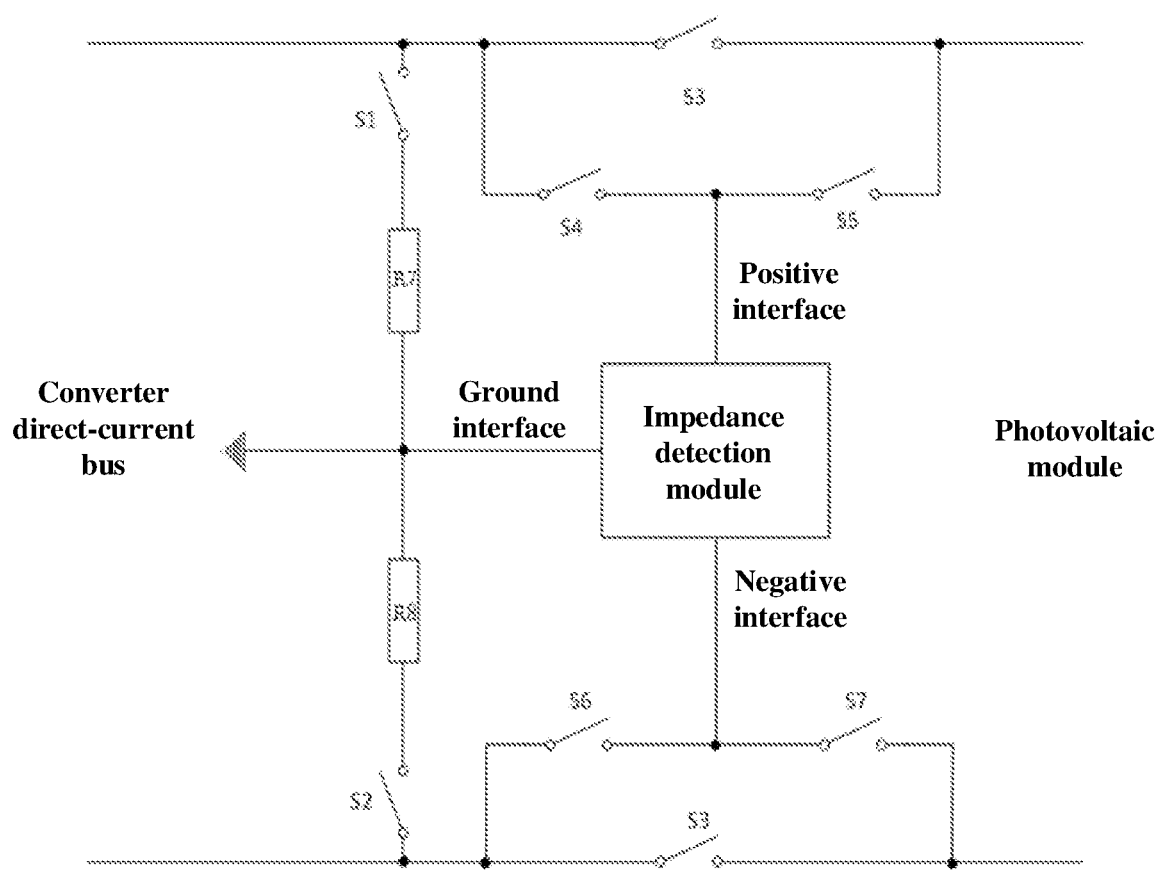
FIG. 1 is a schematic diagram showing connection of an impedance detection module according to some embodiments of the present disclosure.

FIG. 1 is a schematic diagram showing connection of an impedance detection module according to some embodiments of the present disclosure.

As shown in FIG. 1, the insulation impedance detection circuit provided in the present disclosure can, but is not limited to, be used in a converter. The insulation impedance detection circuit comprises an impedance detection module. An insulation impedance value of a direct-current bus to be detected is detected and calculated using the impedance detection module. The impedance detection module can be connected to the direct-current bus to be detected as an independent module. In some embodiments, the insulation impedance detection circuit further comprises a correction circuit provided outside the impedance detection module. The impedance detection module is connected to the direct-current bus to be detected or a converter direct-current bus through the correction circuit. Resistance values of all resistors in the insulation impedance detection circuit are known.

Figure 2:
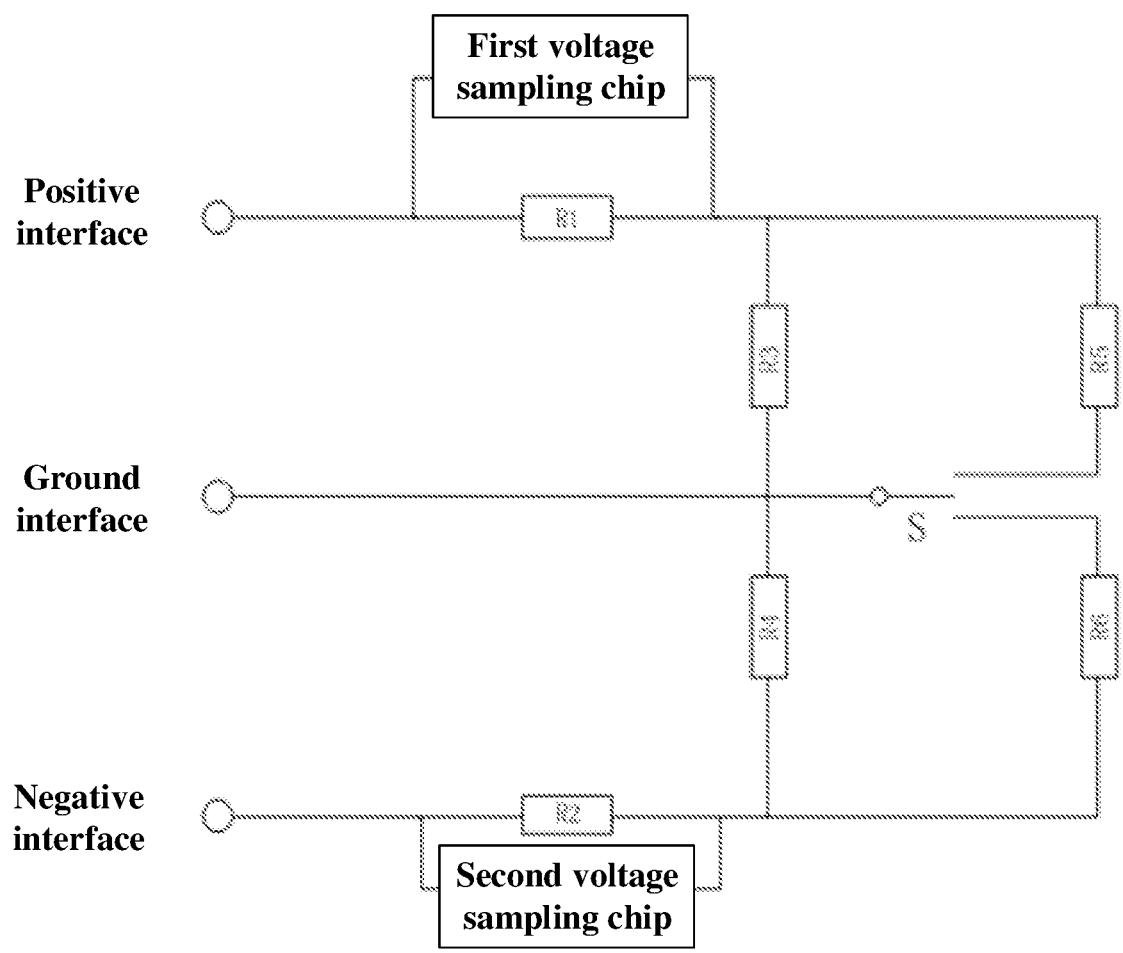
FIG. 2 is a schematic diagram showing connection of an insulation impedance detection circuit according to some embodiments of the present disclosure.

Particularly, as shown in FIG. 2, the impedance detection module is connected between a positive terminal and a negative terminal of a direct-current bus to be detected. The impedance detection module comprises: a first resistance bridge and a second resistance bridge arranged in parallel. The first resistance bridge is composed of a first resistor R3 and a second resistor R4 connected in series, a connection line between the first resistor R3 and the second resistor R4 being grounded. The second resistance bridge is composed of a third resistor R5, a fourth resistor R6 and a first switch S disposed between the third resistor R5 and the fourth resistor R6. The third resistor R5 or the fourth resistor R6 is grounded through the first switch S. In order to facilitate the calculation of the insulation impedance value, in some embodiments, resistance values of the resistor R3, the resistor R4, the resistor R5 and the resistor R6 are the same. For example, the resistance values of the resistor R3, the resistor R4, the resistor R5 and the resistor R6 each can range from 100K Ω (kilohm) to 10000 K Ω.

The first resistor R3 and the third resistor R5 are connected to the positive terminal of the direct-current bus to be detected through a first sampling resistor R1, and the second resistor R4 and the fourth resistor R6 are connected to the negative terminal of the direct-current bus to be detected through a second sampling resistor R2, each of the first sampling resistor R1 and the second sampling resistor R2 being provided with a voltage sampling chip. As shown in FIG. 2, the first sampling resistor R1 is provided with a first voltage sampling chip, and the second sampling resistor R2 is provided with a second voltage sampling chip. The first voltage sampling chip collects a voltage over two terminals of the first sampling resistor R1, and the second voltage sampling chip collects a voltage over two terminals of the second sampling resistor R2. For example, an optocoupler isolation chip can be used as the voltage sampling chip, which has low cost and controllable accuracy. The impedance detection module is configured to calculate an insulation impedance value of the direct-current bus to be detected according to voltage values of two sampling resistors (i.e., the first sampling resistor R1 and the second sampling resistor R2) before and after switching of the first switch S. The insulation impedance value comprises a positive-to-ground impedance value and a negative-to-ground impedance value. The calculation method of the insulation impedance value will be described in detail below.

In some embodiments, a resistance range of the first sampling resistor R1 is 100K Ω to 1000 K Ω, and a resistance range of the second sampling resistor R2 is 100K Ω to 1000 K Ω.

The correction circuit provided outside the impedance detection module comprises: a converter direct-current bus provided in parallel with the direct-current bus to be detected, a positive correction resistor R7 and a second switch S1 connected in series between a positive terminal of the converter direct-current bus and a ground, and a negative correction resistor R8 and a third switch S2 connected in series between a negative terminal of the converter direct-current bus and the ground.

The positive terminal and the negative terminal of the converter direct-current bus each are connected to the direct-current bus to be detected through a circuit breaker S3. Before correcting the voltage sampling chip, a capacitor on the converter direct-current bus is charged. After charging, the circuit breaker S3 is set to an off state, and the bus capacitor on the converter direct-current bus is discharged. During the correction, the impedance detection module calculates an insulation impedance value of the converter direct-current bus according to the voltage values of the two sampling resistors before and after the switching of the first switch S, compares the insulation impedance value with a resistance value of a corresponding correction resistor, and corrects the voltage sampling chip according to a comparison result. The correction here refers to correct an AD (analog signal digital sampling) value of the voltage sampling chip, that is, to reduce a sampling error of the voltage sampling chip.

The impedance detection module is provided with a positive interface connected to the first sampling resistor R1 and a negative interface connected to the second sampling resistor R2. As shown in FIG. 1, the positive interface is connected to the positive terminal of the converter direct-current bus through a fourth switch S4, and to the positive terminal of the direct-current bus to be detected through a fifth switch S5. The negative interface is connected to the negative terminal of the converter direct-current bus through a sixth switch S6, and to the negative terminal of the direct-current bus to be detected through a seventh switch S7. A working state of the correction circuit is as follows.

When the voltage sampling chip is corrected, the fourth switch S4 and the sixth switch S6 are switched on, the fifth switch S5 and the seventh switch S7 are switched off, then the second switch S1 is switched on, the third switch S2 is switched off, the first switch S in the impedance detection module is switched to ground the third resistor R5 and the fourth resistor R6 respectively. The impedance detection module calculates a positive-to-ground impedance value of the converter direct-current bus according to the voltage values of the two sampling resistors before and after the switching of the first switch S, compares the positive-to-ground impedance value with a resistance value of the positive correction resistor, and correct the voltage sampling chip according to a comparison result. Then, the second switch S1 is switched off, the third switch S2 is switched on, the first switch S in the impedance detection module is switched to ground the third resistor R5 and the fourth resistor R6, respectively. The impedance detection module calculates a negative-to-ground impedance value of the converter direct-current bus according to the voltage values of the two sampling resistors before and after the switching of the first switch S, compares the negative-to-ground impedance value with a resistance value of the negative correction resistor, and corrects the voltage sampling chip again according to a comparison result. It should be noted that a sequence of the two corrections can be changed, which is not limited in the present disclosure.

When the impedance detection module calculates an insulation impedance value of the direct-current bus to be detected, the fourth switch S4 and the sixth switch S6 are switched off, the fifth switch S5 and the seventh switch S7 are switched on, the second switch S1 and the third switch S2 are also switched off, the first switch S in the impedance detection module is switched to ground the third resistor R5 and the fourth resistor R6, respectively. The impedance detection module calculates the insulation impedance value of the direct-current bus to be detected according to the voltage values of the two sampling resistors before and after the switching of the first switch S.

Figure 3:
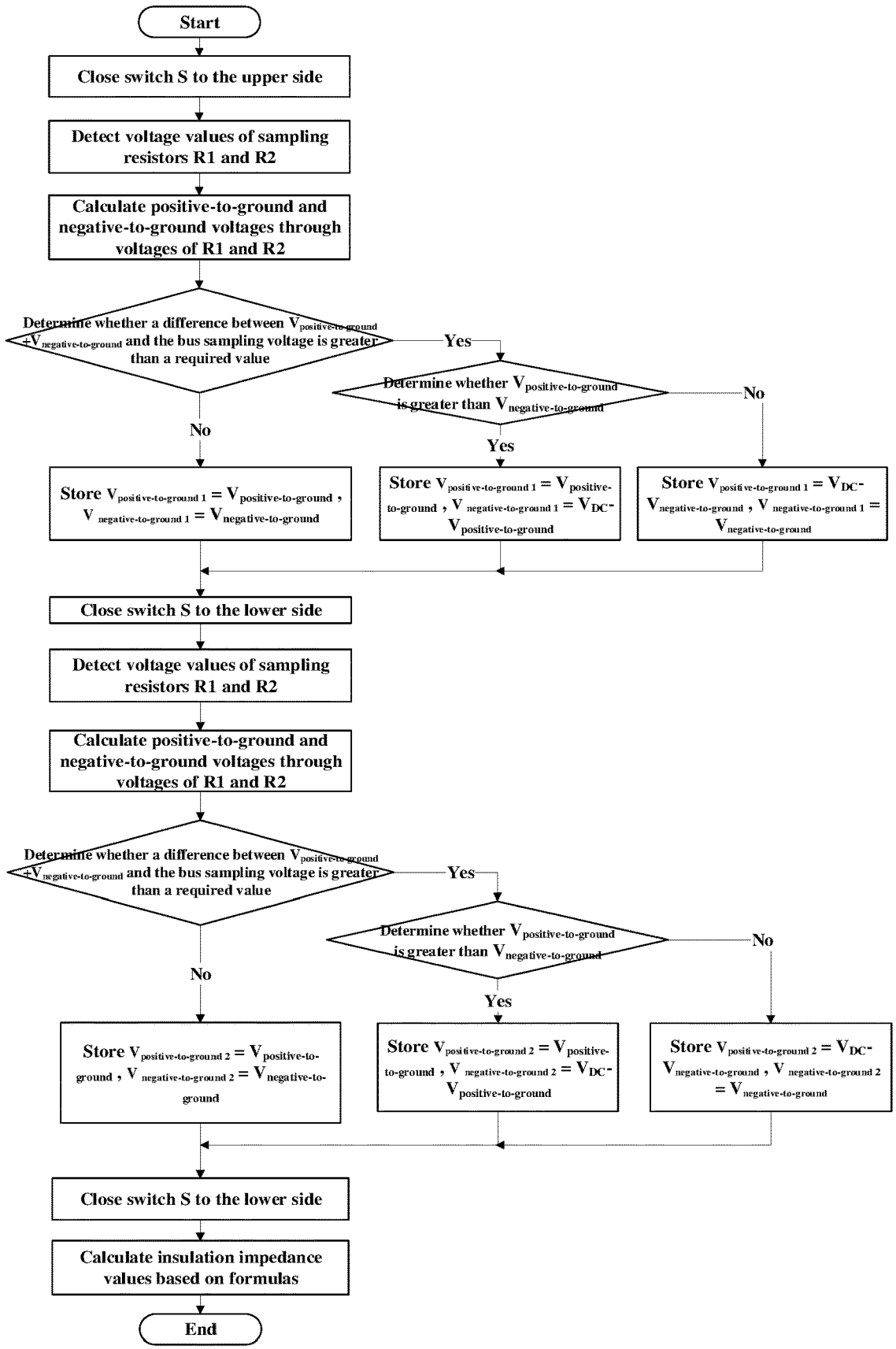
FIG. 3 is a flowchart of a detection method according to some embodiments of the present disclosure.

As shown in FIG. 3, the present disclosure further provides an impedance detection method of the insulation impedance detection circuit, comprising the following steps.

The impedance detection module is connected between the positive terminal and the negative terminal of the direct-current bus to be detected. That is, the fourth switch S4 and the sixth switch S6 are switched off, the fifth switch S5 and the seventh switch S7 are switched on, the second switch S1 and the third switch S2 are switched off, the first sampling resistor R1 is connected to the positive terminal of the direct-current bus to be detected, and the second sampling resistor R2 is connected to the negative terminal of the direct-current bus to be detected.

a first switch S is switched to ground one of the third resistor R5 or the fourth resistor R6. For example, in FIG. 2, the resistor R5 is grounded when the switch S is closed to an upper side; and the resistor R6 is grounded when the switch S is closed to a lower side.

Voltage values of the first sampling resistor R1 and the second sampling resistor R2 are detected, and a first positive-to-ground voltage $V_{positive\text{-}to\text{-}ground\ 1}$ and a first negative-to-ground voltage $V_{negative\text{-}to\text{-}ground\ 1}$ of the direct-current bus to be detected are calculated according to the voltage values.

The first switch S is switched to ground the other one of the third resistor R5 or the fourth resistor R6.

Voltage values of the first sampling resistor R1 and the second sampling resistor R2 are detected, and a second positive-to-ground voltage $V_{positive\text{-}to\text{-}ground\ 2}$ and a second negative-to-ground voltage $V_{negative\text{-}to\text{-}ground\ 2}$ of the direct-current bus to be detected are calculated according to the voltage values.

The insulation impedance value of the direct-current bus to be detected is calculated according to $V_{positive\text{-}to\text{-}ground\ 1}$, $V_{negative\text{-}to\text{-}ground\ 1}$, $V_{positive\text{-}to\text{-}ground\ 2}$, and $V_{negative\text{-}to\text{-}ground\ 2}$.

A specific calculation method in the detection method will be described below taking an example, in which the resistor R5 corresponding to $V_{positive\text{-}to\text{-}ground\ 1}$ and $V_{negative\text{-}to\text{-}ground\ 1}$ is grounded, the resistor R6 corresponding to $V_{positive\text{-}to\text{-}ground\ 2}$ and $V_{negative\text{-}to\text{-}ground\ 2}$ is grounded.

Calculation formulas for calculating the first positive-to-ground voltage $V_{positive\text{-}to\text{-}ground\ 1}$ and the first negative-to-ground voltage $V_{negative\text{-}to\text{-}ground\ 1}$ of the direct-current bus to be detected according to the voltage values are $$V_{positive\text{-}to\text{-}ground\ 1} = \frac{V_{R1}}{R_1} \times \left( \frac{R_3 R_5}{R_3 + R_5} + R_1 \right),$$

$$\text{and } V_{negative\text{-}to\text{-}ground\ 1} = \frac{V_{R2}}{R_2} \times (R_4 + R_2).$$

Calculation formulas for calculating the second positive-to-ground voltage $V_{positive\text{-}to\text{-}ground\ 2}$ and the second negative-to-ground voltage $V_{negative\text{-}to\text{-}ground\ 2}$ of the direct-current bus to be detected according to the voltage values are $$V_{positive\text{-}to\text{-}ground\ 2} = \frac{V'_{R1}}{R_1} \times (R_3 + R_1),$$

$$\text{and } V_{negative\text{-}to\text{-}ground\ 2} = \frac{V'_{R2}}{R_2} \times \left( \frac{R_4 R_6}{R_4 + R_6} + R_2 \right).$$

Here, $V_{R1}$ is a voltage value of the first sampling resistor R1 when the third resistor R5 is grounded, $V_{R1'}$ is a voltage value of the first sampling resistor R1 when the fourth resistor R6 is grounded, $V_{R2}$ is a voltage value of the second sampling resistor R2 when the third resistor R5 is grounded, and $V_{R2'}$ is a voltage value of the second sampling resistor R2 when the fourth resistor R6 is grounded.

Further, since the voltage sampling chip is nonlinear and has a large error when the sampling voltage is low, in order to improve the accuracy of $V_{positive\text{-}to\text{-}ground\ 1}$ and $V_{negative\text{-}to\text{-}ground\ 1}$, after calculating the first positive-to-ground voltage $V_{positive\text{-}to\text{-}ground\ 1}$ and the first negative-to-ground voltage $V_{negative\text{-}to\text{-}ground\ 1}$ of the direct-current bus to be detected according to the voltage values, since a correct relationship should be $V_{positive\text{-}to\text{-}ground\ 1} + V_{negative\text{-}to\text{-}ground\ 1} = V_{DC}$, it can be determined whether the voltages to ground calculated above are accurate by determining whether $|V_{positive\text{-}to\text{-}ground\ 1} + V_{negative\text{-}to\text{-}ground\ 1} - V_{DC}| \geq V_{set}$. Here, $V_{DC}$ is a bus voltage of the direct-current bus to be detected, which can be obtained by direct collection, and $V_{set}$ is a set voltage error value, which can be set by artificial input according to the actual situation. For example, the set voltage error value $V_{set}$ ranges from 100V to 1000V.

If yes, $V_{positive\text{-}to\text{-}ground\ 1}$ is compared with $V_{negative\text{-}to\text{-}ground\ 1}$; $V_{positive\text{-}to\text{-}ground\ 1} = V_{positive\text{-}to\text{-}ground\ 1}$, and $V_{negative\text{-}to\text{-}ground\ 1} = V_{DC} - V_{positive\text{-}to\text{-}ground\ 1}$ are stored when $V_{positive\text{-}to\text{-}ground\ 1} > V_{negative\text{-}to\text{-}ground\ 1}$; and $V_{negative\text{-}to\text{-}ground\ 1} = V_{negative\text{-}to\text{-}ground\ 1}$, and $V_{positive\text{-}to\text{-}ground\ 1} = V_{DC} - V_{negative\text{-}to\text{-}ground\ 1}$ are stored when $V_{positive\text{-}to\text{-}ground\ 1} \leq V_{negative\text{-}to\text{-}ground\ 1}$.

If not, $V_{positive\text{-}to\text{-}ground\ 1} = V_{positive\text{-}to\text{-}ground\ 1}$, and $V_{negative\text{-}to\text{-}ground\ 1} = V_{negative\text{-}to\text{-}ground\ 1}$ are stored.

Similarly, in order to improve the accuracy of $V_{positive\text{-}to\text{-}ground\ 2}$ and $V_{negative\text{-}to\text{-}ground\ 2}$, after calculating the second positive-to-ground voltage $V_{positive\text{-}to\text{-}ground\ 2}$ and the second negative-to-ground voltage $V_{negative\text{-}to\text{-}ground\ 2}$ of the direct-current bus to be detected according to the voltage values, since a correct relationship should be $V_{positive\text{-}to\text{-}ground\ 2} + V_{negative\text{-}to\text{-}ground\ 2} = V_{DC}$, it is determined whether the voltages to ground calculated above are accurate by determining whether $|V_{positive-to-ground\ 2} + V_{negative-to-ground\ 2} - V_{DC}| \geq V_{set}$.

If yes, $V_{positive-to-ground\ 2}$ is compared with $V_{negative-to-ground\ 2}$; $V_{positive-to-ground\ 2} = V_{positive-to-ground\ 2'}$ and $V_{negative-to-ground\ 2} = V_{DC} - V_{positive-to-ground\ 2}$ are stored when $V_{positive-to-ground\ 2} > V_{negative-to-ground\ 2}$; and $V_{negative-to-ground\ 2} = V_{negative-to-ground\ 2'}$ and $V_{positive-to-ground\ 2} = V_{DC} - V_{negative-to-ground\ 2}$ are stored when $V_{positive-to-ground\ 2} \leq V_{negative-to-ground\ 2}$.

If not, $V_{positive-to-ground\ 2} = V_{positive-to-ground\ 2'}$ and $V_{negative-to-ground\ 2} = V_{negative-to-ground\ 2'}$ are stored.

Finally, calculation formulas for calculating the insulation impedance value of the direct-current bus to be detected according to $V_{positive-to-ground\ 1}$, $V_{negative-to-ground\ 1}$, $V_{positive-to-ground\ 2}$ and $V_{negative-to-ground\ 2}$ are:

$$\frac{V_{positive-to-ground\ 1}}{R_x} + \frac{V_{positive-to-ground\ 1}}{R_1 + (R_3//R_5)} =$$

$$\frac{V_{negative-to-ground\ 1}}{R_y} + \frac{V_{negative-to-ground\ 1}}{R_2 + R_4},$$

$$\frac{V_{positive-to-ground\ 2} R_x}{R_y} + \frac{V_{positive-to-ground\ 2}}{R_1 + R_3} =$$

$$\frac{V_{negative-to-ground\ 2}}{R_y} + \frac{V_{negative-to-ground\ 2}}{R_2 + (R_4//R_6)},$$

wherein $R_x$ is a positive-to-ground impedance value, and $R_y$ is a negative-to-ground impedance value.

It should be noted that, during the correction process, the direct-current bus to be detected is disconnected from the impedance detection module, and the converter direct-current bus, as the direct-current bus to be detected, is connected to the impedance detection module. The subsequent switching process of the switch S and the calculation process of the insulation impedance value are identical to those described above.

In some embodiments, the impedance detection method further comprises: correcting the voltage sampling chip; and connecting the impedance detection module between the positive terminal and the negative terminal of the direct-current bus to be detected after correction is completed. The correction process has been described in detail above and will not be repeated here. Furthermore, after closing the switch S4 and the switch S6, and opening the switch S5 and the switch S7 during the correction process, the impedance detection board first detects and calculates the insulation impedance value of the converter direct-current bus, so as to judge the insulation impedance performance of the converter, regardless of the accuracy of the calculated impedance value. If a difference between the insulation impedance value and a resistance value of a corresponding correction resistor exceeds a set impedance error value, an alarm signal indicating an insulation impedance fault will be sent out, and the correction process will stop. The set impedance error value can be set by human input according to the actual situation.

The present disclosure further provides a photovoltaic centrifuge with the converter described above, wherein the direct-current bus to be detected is a direct-current bus of a photovoltaic module, and an insulation impedance value of the photovoltaic module is detected and calculated through the impedance detection module.

Compared with the related art, the above technical solution of the present disclosure has the following technical effects. 1. Sampling resistors are designed between the positive and negative terminals of the direct-current bus to be detected, each sampling resistor being equipped with a lower cost voltage sampling chip. Positive-to-ground and negative-to-ground voltages can be calculated based on collected voltage values. The circuit has low cost and high practicality. 2. A correction circuit is designed outside the impedance detection module to correct the sampling accuracy of the voltage sampling chip, so that the accuracy of calculation of the insulation impedance value can be improved, and the error of the insulation impedance value can be reduced. 3. The correction circuit is applicable to different impedance detection modules. The impedance detection module can correct itself before calculating the insulation impedance value of the direct-current bus to be detected, and then collect voltage values of the sampling resistors after the correction, which is flexible and suitable for popularization.

The above is merely preferred embodiments of the present disclosure, and is not limitation to the present disclosure. Within spirit and principles of the present disclosure, any modification, equivalent substitution, improvement and so on shall be contained in the protection scope of the present disclosure.

What is claimed is:

1. An insulation impedance detection circuit, comprising: an impedance detection module connected between a positive terminal and a negative terminal of a direct-current bus to be detected, the impedance detection module comprising a first resistance bridge and a second resistance bridge arranged in parallel, wherein the first resistance bridge is composed of a first resistor R3 and a second resistor R4 connected in series, a connection line between the first resistor R3 and the second resistor R4 being grounded, and the second resistance bridge is composed of a third resistor R5, a fourth resistor R6, and a first switch S disposed between the third resistor R5 and the fourth resistor R6, the third resistor R5 or the fourth resistor R6 being grounded through the first switch S;

wherein the first resistor R3 and the third resistor R5 are connected to the positive terminal of the direct-current bus to be detected through a first sampling resistor R1, the second resistor R4 and the fourth resistor R6 are connected to the negative terminal of the direct-current bus to be detected through a second sampling resistor R2, each of the first sampling resistor R1 and the second sampling resistor R2 being provided with a voltage sampling chip, and the impedance detection module is configured to calculate an insulation impedance value of the direct-current bus to be detected according to voltage values of two sampling resistors before and after switching of the first switch S.

2. The insulation impedance detection circuit according to claim 1, further comprising: a converter direct-current bus provided in parallel with the direct-current bus to be detected, a positive correction resistor R7 and a second switch S1 connected in series between a positive terminal of the converter direct-current bus and a ground, and a negative correction resistor R8 and a third switch S2 connected in series between a negative terminal of the converter direct-current bus and the ground;

wherein the impedance detection module is configured to calculate an insulation impedance value of the converter direct-current bus according to the voltage values of the two sampling resistors before and after the switching of the first switch S, compare the insulation impedance value with a resistance value of a corresponding correction resistor and correct the voltage sampling chip according to a comparison result.

3. The insulation impedance detection circuit according to claim 2, wherein the impedance detection module is further configured to send out an alarm signal indicating an insulation impedance fault in a case where a difference between the insulation impedance value of the converter direct-current bus and the resistance value of the corresponding correction resistor exceeds a set impedance error value.

4. The insulation impedance detection circuit according to claim 2, wherein:
the impedance detection module is further configured to calculate a positive-to-ground impedance value of the converter direct-current bus according to the voltage values of the two sampling resistors before and after the switching of the first switch S when the second switch S1 is switched on and the third switch S2 is switched off, compare the positive-to-ground impedance value with a resistance value of the positive correction resistor R7, and correct the voltage sampling chip according to a comparison result; and calculate a negative-to-ground impedance value of the converter direct-current bus according to the voltage values of the two sampling resistors before and after the switching of the first switch S when the second switch S1 is switched off and the third switch S2 is switched on, compare the negative-to-ground impedance value with a resistance value of the negative correction resistor R8, and correct the voltage sampling chip according to a comparison result.

5. The insulation impedance detection circuit according to claim 2, wherein the positive terminal and the negative terminal of the converter direct-current bus each are connected to the direct-current bus to be detected through a circuit breaker S3;
wherein the circuit breaker S3 is in an off state and a bus capacitor on the converter direct-current bus is discharged when the impedance detection module calculates the insulation impedance value of the converter direct-current bus.

6. The insulation impedance detection circuit according to claim 2, wherein the impedance detection module is provided with a positive interface connected to the first sampling resistor R1 and a negative interface connected to the second sampling resistor R2, the positive interface being connected to the positive terminal of the converter direct-current bus through a fourth switch S4, and to the positive terminal of the direct-current bus to be detected through a fifth switch S5, and the negative interface being connected to the negative terminal of the converter direct-current bus through a sixth switch S6, and to the negative terminal of the direct-current bus to be detected through a seventh switch S7;
wherein when the impedance detection module calculates the insulation impedance value of the converter direct-current bus, the fourth switch S4 and the sixth switch S6 are switched on, and the fifth switch S5 and the seventh switch S7 are switched off; and
when the impedance detection module calculates the insulation impedance value of the direct-current bus to be detected, the fourth switch S4 and the sixth switch S6 are switched off, and the fifth switch S5 and the seventh switch S7 are switched on.

7. The insulation impedance detection circuit according to claim 1, wherein resistance values of the first resistor R3, the second resistor R4, the third resistor R5, and the fourth resistor R6 are the same.

8. An impedance detection method for calculating insulation impedance value of Direct Current bus using the insulation impedance detection circuit according to claim 1, wherein the impedance detection method comprises:
connecting the impedance detection module between the positive terminal and the negative terminal of the direct-current bus to be detected;
switching the first switch S to ground one of the third resistor R5 or the fourth resistor R6;
detecting voltage values of the first sampling resistor R1 and the second sampling resistor R2, and calculating a first positive-to-ground voltage $V_{positive\text{-}to\text{-}ground\ 1}$ and a first negative-to-ground voltage $V_{negative\text{-}to\text{-}ground\ 1}$ of the direct-current bus to be detected according to the voltage values;
switching the first switch S to ground another one of the third resistor R5 or the fourth resistor R6;
detecting voltage values of the first sampling resistor R1 and the second sampling resistor R2, and calculating a second positive-to-ground voltage $V_{positive\text{-}to\text{-}ground\ 2}$ and a second negative-to-ground voltage $V_{negative\text{-}to\text{-}ground\ 2}$ of the direct-current bus to be detected according to the voltage values; and
calculating the insulation impedance value of the direct-current bus to be detected according to the first positive-to-ground voltage $V_{positive\text{-}to\text{-}ground\ 1}$, the first negative-to-ground voltage $V_{negative\text{-}to\text{-}ground\ 1}$, the second positive-to-ground voltage $V_{positive\text{-}to\text{-}ground\ 2}$ and the second negative-to-ground voltage $V_{negative\text{-}to\text{-}ground\ 2}$.

9. The impedance detection method according to claim 8, wherein:
when the third resistor R5 corresponding to $V_{positive\text{-}to\text{-}ground\ 1}$ and $V_{negative\text{-}to\text{-}ground\ 1}$ is grounded, and the fourth resistor R6 corresponding to $V_{positive\text{-}to\text{-}ground\ 2}$ and $V_{negative\text{-}to\text{-}ground\ 2}$ is grounded,
calculation formulas for calculating the first positive-to-ground voltage $V_{positive\text{-}to\text{-}ground\ 1}$ and the first negative-to-ground voltage $V_{negative\text{-}to\text{-}ground\ 1}$ of the direct-current bus to be detected according to the voltage values are $$V_{positive-to-ground\ 1} = \frac{V_{R1}}{R_1} \times \left(\frac{R_3 R_5}{R_3 + R_5} + R_1\right),$$

$$\text{and } V_{negative-to-ground\ 1} = \frac{V_{R2}}{R_2} \times (R_4 + R_2), \text{ and}$$

calculation formulas for calculating the second positive-to-ground voltage $V_{positive\text{-}to\text{-}ground\ 2}$ and the second negative-to-ground voltage $V_{negative\text{-}to\text{-}ground\ 2}$ of the direct-current bus to be detected according to the voltage values are $$V_{positive-to-ground\ 2} = \frac{V'_{R1}}{R_1} \times (R_3 + R_1),$$

$$\text{and } V_{negative-to-ground\ 2} = \frac{V'_{R2}}{R_2} \times \left(\frac{R_4 R_6}{R_4 + R_6} + R_2\right);$$

wherein $V_{R1}$ is a voltage value of the first sampling resistor R1 when the third resistor R5 is grounded, $V_{R1}'$ is a voltage value of the first sampling resistor R1 when the fourth resistor R6 is grounded, $V_{R2}$ is a voltage value of the second sampling resistor R2 when the third resistor R5 is grounded, and $V_{R2}'$ is a voltage value of the second sampling resistor R2 when the fourth resistor R6 is grounded.

10. The impedance detection method according to claim 8, wherein it is determined whether $|V_{positive\text{-}to\text{-}ground\ 1} + V_{negative\text{-}to\text{-}ground\ 1} - V_{DC}| \geq V_{set}$ after calculating the first positive-to-ground voltage $V_{positive\text{-}to\text{-}ground\ 1}$ and the first negative-to-ground voltage $V_{negative\text{-}to\text{-}ground\ 1}$ of the direct-current bus to be detected according to the voltage values, wherein $V_{DC}$ is a bus voltage of the direct-current bus to be detected, and $V_{set}$ is a set voltage error value;

if yes, $V_{positive\text{-}to\text{-}ground\ 1}$ is compared with $V_{negative\text{-}to\text{-}ground\ 1}$; $V_{positive\text{-}to\text{-}ground\ 1} = V_{positive\text{-}to\text{-}ground\ 1}$, and $V_{negative\text{-}to\text{-}ground\ 1} = V_{DC} - V_{positive\text{-}to\text{-}ground\ 1}$ are stored when $V_{positive\text{-}to\text{-}ground\ 1} > V_{negative\text{-}to\text{-}ground\ 1}$; and $V_{negative\text{-}to\text{-}ground\ 1} = V_{negative\text{-}to\text{-}ground\ 1}$, and $V_{positive\text{-}to\text{-}ground\ 1} = V_{DC} - V_{negative\text{-}to\text{-}ground\ 1}$ are stored when $V_{positive\text{-}to\text{-}ground\ 1} \leq V_{negative\text{-}to\text{-}ground\ 1}$; and if not, $V_{positive\text{-}to\text{-}ground\ 1} = V_{positive\text{-}to\text{-}ground\ 1}$, and $V_{negative\text{-}to\text{-}ground\ 1} = V_{negative\text{-}to\text{-}ground\ 1}$ are stored.

11. The impedance detection method according to claim 8, wherein it is determined whether $|V_{positive\text{-}to\text{-}ground\ 2} + V_{negative\text{-}to\text{-}ground\ 2} - V_{DC}| \geq V_{set}$ after calculating the second positive-to-ground voltage $V_{positive\text{-}to\text{-}ground\ 2}$ and the second negative-to-ground voltage $V_{negative\text{-}to\text{-}ground\ 2}$ of the direct-current bus to be detected according to the voltage values, wherein $V_{DC}$ is a bus voltage of the direct-current bus to be detected, and $V_{set}$ is a set voltage error value;

if yes, $V_{positive\text{-}to\text{-}ground\ 2}$ is compared with $V_{negative\text{-}to\text{-}ground\ 2}$; $V_{positive\text{-}to\text{-}ground\ 2} = V_{positive\text{-}to\text{-}ground\ 2}$, and $V_{negative\text{-}to\text{-}ground\ 2} = V_{DC} - V_{positive\text{-}to\text{-}ground\ 2}$ are stored when $V_{positive\text{-}to\text{-}ground\ 2} \geq V_{negative\text{-}to\text{-}ground\ 2}$; and $V_{negative\text{-}to\text{-}ground\ 2} = V_{negative\text{-}to\text{-}ground\ 2}$, and $V_{positive\text{-}to\text{-}ground\ 2} = V_{DC} - V_{negative\text{-}to\text{-}ground\ 2}$ are stored when $V_{positive\text{-}to\text{-}ground\ 2} \leq V_{negative\text{-}to\text{-}ground\ 2}$; and if not, $V_{positive\text{-}to\text{-}ground\ 2} = V_{positive\text{-}to\text{-}ground\ 2}$, and $V_{negative\text{-}to\text{-}ground\ 2} = V_{negative\text{-}to\text{-}ground\ 2}$ are stored.

12. The impedance detection method according to claim 8, wherein when the third resistor R5 corresponding to $V_{positive\text{-}to\text{-}ground\ 1}$ and $V_{negative\text{-}to\text{-}ground\ 1}$ is grounded, and the fourth resistor R6 corresponding to $V_{positive\text{-}to\text{-}ground\ 2}$ and $V_{negative\text{-}to\text{-}ground\ 2}$ is grounded, calculation formulas for calculating the insulation impedance value of the direct-current bus to be detected according to $V_{positive\text{-}to\text{-}ground\ 1}$, $V_{negative\text{-}to\text{-}ground\ 1}$, $V_{positive\text{-}to\text{-}ground\ 2}$ and $V_{negative\text{-}to\text{-}ground\ 2}$ are:

$$\frac{V_{positive-to-ground\ 1}}{R_x} + \frac{V_{positive-to-ground\ 1}}{R_1 + (R_3//R_5)} =$$

$$\frac{V_{negative-to-ground\ 1}}{R_y} + \frac{V_{negative-to-ground\ 1}}{R_2 + R_4},$$

$$\frac{V_{positive-to-ground\ 2} R_x}{R_y} + \frac{V_{positive-to-ground\ 2}}{R_1 + R_3} =$$

$$\frac{V_{negative-to-ground\ 2}}{R_y} + \frac{V_{negative-to-ground\ 2}}{R_2 + (R_4//R_6)},$$

wherein $R_x$ is a positive-to-ground impedance value, and $R_y$ is a negative-to-ground impedance value.

13. The impedance detection method according to claim 8, wherein the impedance detection method further comprises:

correcting the voltage sampling chip; and connecting the impedance detection module between the positive terminal and the negative terminal of the direct-current bus to be detected after correction is completed.

14. A converter, wherein the converter comprises the insulation impedance detection circuit according to claim 1.

15. A photovoltaic centrifuge, comprising the converter according to claim 14, wherein the direct-current bus to be detected is a direct-current bus of a photovoltaic module.

* * * * *

UNITED STATES PATENT AND TRADEMARK OFFICE
CERTIFICATE OF CORRECTION

PATENT NO. : 12,105,135 B2
APPLICATION NO. : 18/016112
DATED : October 1, 2024
INVENTOR(S) : Yongying Guo et al.

It is certified that error appears in the above-identified patent and that said Letters Patent is hereby corrected as shown below:

In the Claims

Column 11, Line 39, Claim 11, delete "$V_{\text{positive-to-ground 2}} \geq V_{\text{negative-to-ground 2}};$" and insert -- $V_{\text{positive-to-ground 2}} > V_{\text{negative-to-ground 2}};$ --

Column 12, Lines 20-21, Claim 12, delete "$\dfrac{V_{\text{positive-to-ground 2}} R_x}{R_y}$" and insert -- $\dfrac{V_{positive-to-ground\ 2}}{R_x}$ --

Signed and Sealed this
Tenth Day of December, 2024

Katherine Kelly Vidal
*Director of the United States Patent and Trademark Office*